US012699114B2

(12) United States Patent
de Feijter et al.

(10) Patent No.: US 12,699,114 B2
(45) Date of Patent: Aug. 4, 2026

(54) PROBE CARD DESIGN FOR OPTIMAL CURRENT DISTRIBUTION

(71) Applicant: Menlo Microsystems, Inc., Irvine, CA (US)

(72) Inventors: Maxwell Connor de Feijter, Menands, NY (US); Chris Nassar, Hudson, NY (US); Michael Reilly Comstock, Newtonville, NY (US); Xu Zhu, Belmont, MA (US)

(73) Assignee: Menlo Microsystems, Inc., Irvine, CA (US)

( * ) Notice: Subject to any disclaimer, the term of this patent is extended or adjusted under 35 U.S.C. 154(b) by 249 days.

(21) Appl. No.: 18/733,273

(22) Filed: Jun. 4, 2024

(65) Prior Publication Data

US 2025/0370005 A1      Dec. 4, 2025

(51) Int. Cl.
G01R 1/073          (2006.01)

(52) U.S. Cl.
CPC ............................... G01R 1/07342 (2013.01)

(58) Field of Classification Search
CPC ... G01R 1/00; G01R 1/02; G01R 1/06; G01R 1/067; G01R 1/073; G01R 1/07307; G01R 1/07342
USPC .......... 324/500, 537, 754.01, 754.03, 754.18
See application file for complete search history.

(56) References Cited

U.S. PATENT DOCUMENTS

| | | | |
|---|---|---|---|
| 6,191,601 | B1 | 2/2001 | Swart |
| 6,674,174 | B2 | 1/2004 | Chungpaiboonpatana et al. |
| 7,012,811 | B1 | 3/2006 | Jiang et al. |

(Continued)

FOREIGN PATENT DOCUMENTS

| | | | | | |
|---|---|---|---|---|---|
| CN | 107367678 | B | * | 3/2020 | ......... G01R 1/07342 |
| CN | 115932518 | A | * | 4/2023 | ......... G01R 1/07385 |

(Continued)

OTHER PUBLICATIONS

Altium Designer, "Interactively Tuning the Lengths of Your Routes on a PCB in Altium Designer", version: 23, available online at: <https://www.altium.com/documentation/altium-designer/length-tuning-pcb>, Dec. 8, 2022, Accessed on Oct. 17, 2023, 29 pages.

(Continued)

*Primary Examiner* — Hoai-An D. Nguyen
(74) *Attorney, Agent, or Firm* — Hamilton, Brook, Smith & Reynolds, P.C.

(57)          ABSTRACT

Embodiments disclose a micro-electrical-mechanical-system (MEMS) test-circuit structure. The test-circuit structure includes a wafer layer having an electrically conductive trace terminating to a plurality of respective pins at a first end of the electrically conductive trace and terminating to a plurality of connection locations at a second of the electrically conductive trace. The test-circuit structure also includes a plurality of connection probes coupled to the plurality of respective pins at the first end the electrically conductive trace, the connection probes are configured to electrically connect to the MEMS device under test. The electrical characteristics of the electrically conductive trace are measured from the plurality of connection probes to the plurality of connection locations having substantially identical electrical characteristics.

18 Claims, 14 Drawing Sheets

(56)  References Cited

U.S. PATENT DOCUMENTS

| | | | | |
|---|---|---|---|---|
| 7,902,853 B2 * | 3/2011 | Uchida | ............ | G01R 31/31701 |
| | | | | 714/719 |
| 9,322,844 B2 * | 4/2016 | Shinohara | .......... | G01R 1/06711 |
| 10,295,566 B2 * | 5/2019 | Cadena | ................ | G01R 1/0735 |
| 10,325,053 B2 | 6/2019 | Shen et al. | | |
| 12,032,002 B2 * | 7/2024 | Tadayon | ............ | G01R 1/06716 |
| 12,092,661 B2 * | 9/2024 | Su | ....................... | G01R 1/06727 |
| 2010/0123472 A1 * | 5/2010 | Saijou | ................ | G01R 31/2884 |
| | | | | 324/756.03 |
| 2011/0169517 A1 | 7/2011 | Kim et al. | | |

FOREIGN PATENT DOCUMENTS

| | | | | | |
|---|---|---|---|---|---|
| KR | 102878120 B1 * | 10/2025 | | ......... | G01R 1/07364 |
| TW | I636260 B * | 9/2018 | | ......... | G01R 31/2851 |

OTHER PUBLICATIONS

Faheemuddin, M., "What is Signal Propegation Delay on PCBs?", Sierra Circuits, available online at: <https://www.protoexpress.com/blog/signal-propagation-delay-pcb/>, Oct. 12, 2023, Accessed on Oct. 17, 2023, 13 pages.

Parallel Systems, "A Parallel Systems Technical Note—How to define Differential Pairs", available online at: <https://www.parallel-systems.co.uk/images/PDF/diffpairs_definition.pdf>, 2016, Accessed on Oct. 17, 2023, 12 pages.

Peterson, ZM., "Guide to PCB Trace Length Matching in High Speed Design", available online at: <https://www.nwengineeringllc.com/article/guide-to-pcb-trace-length-matching-in-high-speed-design.php>, Apr. 8, 2020, Accessed on Oct. 17, 2023, 7 pages.

Quadra Solutions, "Quadra Solutions' guide to PCB track length matching in high-speed design", available online at: <https://quadrasol.co.uk/services/pcb-design/>, Jul. 20, 2017, Accessed on Oct. 17, 2023, 5 pages.

* cited by examiner

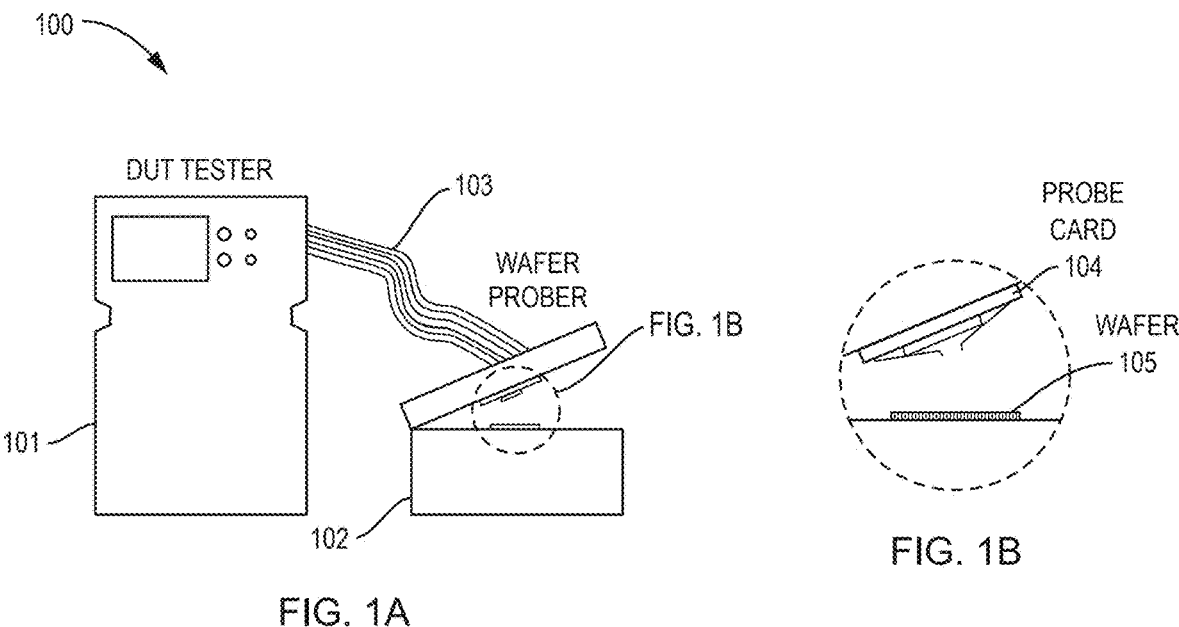
FIG. 1A
FIG. 1B
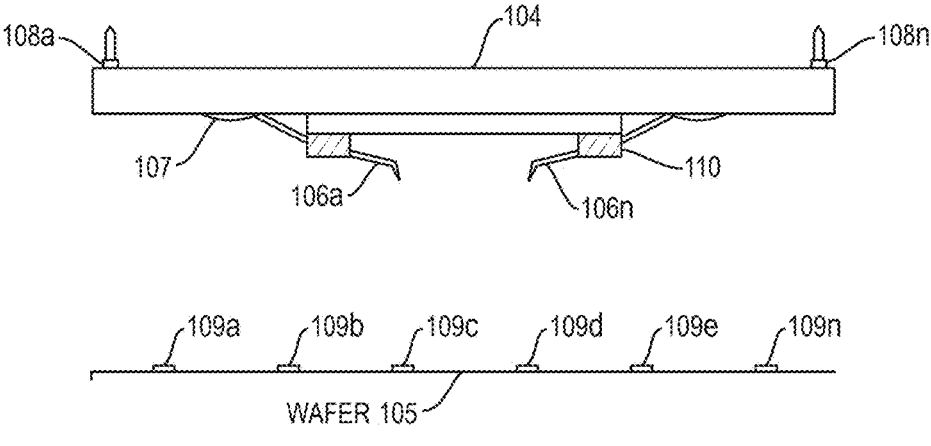
FIG. 1C

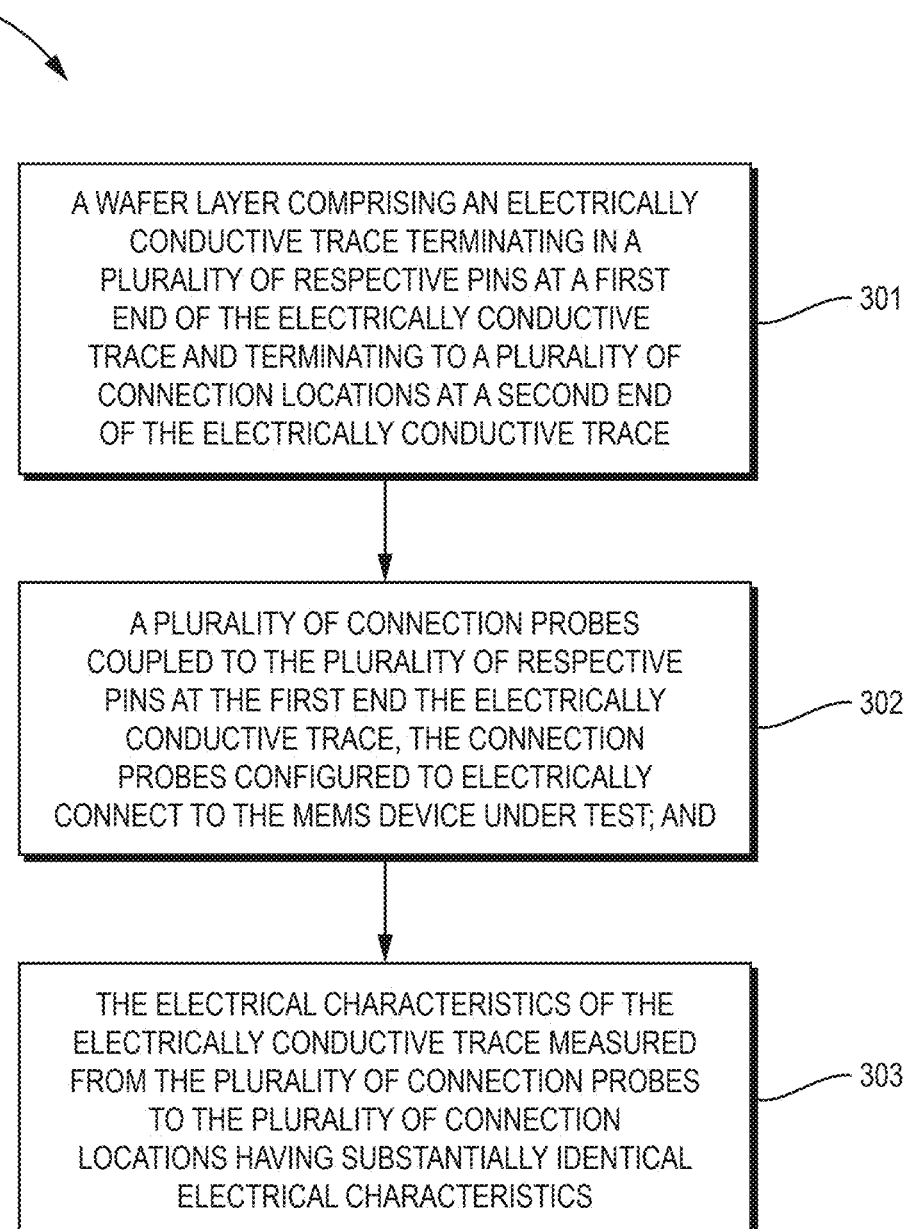

300

A WAFER LAYER COMPRISING AN ELECTRICALLY CONDUCTIVE TRACE TERMINATING IN A PLURALITY OF RESPECTIVE PINS AT A FIRST END OF THE ELECTRICALLY CONDUCTIVE TRACE AND TERMINATING TO A PLURALITY OF CONNECTION LOCATIONS AT A SECOND END OF THE ELECTRICALLY CONDUCTIVE TRACE — 301

A PLURALITY OF CONNECTION PROBES COUPLED TO THE PLURALITY OF RESPECTIVE PINS AT THE FIRST END THE ELECTRICALLY CONDUCTIVE TRACE, THE CONNECTION PROBES CONFIGURED TO ELECTRICALLY CONNECT TO THE MEMS DEVICE UNDER TEST; AND — 302

THE ELECTRICAL CHARACTERISTICS OF THE ELECTRICALLY CONDUCTIVE TRACE MEASURED FROM THE PLURALITY OF CONNECTION PROBES TO THE PLURALITY OF CONNECTION LOCATIONS HAVING SUBSTANTIALLY IDENTICAL ELECTRICAL CHARACTERISTICS — 303

CAUTION:
High current

NORTH

SOUTH

620

611

610

PROBE CARD DESIGN FOR OPTIMAL CURRENT DISTRIBUTION

BACKGROUND

A probe card, also referred to as a device under test (DUT), acts as the intermediary connection between a circuit to be tested and the testing equipment. The probe card's main function is to act as the electrical connection path between the DUT and the testing equipment. The probe card and test equipment configuration allow manufacturers the ability to rapidly test designs before the silicon wafers are diced and packaged. However, as improvements to device architectures continue to progress, the internal resistance within the device can be so low that any variation of resistance within the probe card itself can skew results. In the scenario of testing a relay type of device with an expected internal resistance in the milliohm range, the resistance of the probe card can be significantly larger (an order of magnitude or more) larger than the resistance of the DUT. As such, a probe card with precisely balanced and optimized current distribution is required.

SUMMARY

The embodiments described herein provide improvements to current flow and heat dissipation on a micro-electrical-mechanical-system (MEMS) test-circuit structure, allowing for testing of devices with low resistance.

An embodiment is directed toward a MEMS test-circuit structure. The test-circuit structure includes a wafer layer (i.e., a thin slice of semiconductor making up part of the MEMS device) having an electrically conductive trace terminating to a plurality of respective pins at a first end of the electrically conductive trace and terminating to a plurality of connection locations at a second end of the electrically conductive trace. The test-circuit structure also includes a plurality of connection probes coupled to the plurality of respective pins at the first end of the electrically conductive trace, the connection probes configured to electrically connect to the MEMS device under test. Further, in the test-circuit structure the electrical characteristics of the electrically conductive trace are measured from the plurality of connection probes to the plurality of connection locations having substantially identical electrical characteristics.

An embodiment includes an epoxy ring at a central location of the MEMS test-circuit structure, the epoxy ring encompasses the plurality of connection probes.

In another embodiment the electrical characteristics of the electrically conductive trace are measured from a furthest end of each connection probe of the plurality of connection probes to a test-equipment connection, where the test-equipment connection is located beyond a connection location of the plurality of connection locations.

Another embodiment includes a second electrically conductive trace terminating to a plurality of respective pins at a first end of the second electrically conductive trace. The second electrically conductive trace terminates to a plurality of connection locations at a second end of the second electrically conductive trace.

In yet another embodiment, the length of the first electrically conductive trace is greater than the length of the second electrically conductive trace such that the resistance of the first electrically conductive trace is substantially equal to the resistance of the second electrically conductive trace.

In an embodiment, the width of the first electrically conductive trace is greater than the width of the second electrically conductive trace such that the resistance of the first electrically conductive trace is substantially equal to the resistance of the second electrically conductive trace. In some embodiments, both the width and length of the first electrically conductive trace may be greater than the width and length, respectively, of the second electrically conductive trace such that the resistance of the first electrically conductive trace is substantially equal to the resistance of the second electrically conductive trace.

In an embodiment, the electrical characteristics include one or more of electrical resistance, material composition, parasitic inductance, and/or parasitic capacitance.

In another embodiment, the wafer layer is a printed circuit board (PCB).

Another embodiment includes an epoxy ring at a central location of the MEMS test-circuit structure, wherein the epoxy ring encompasses the plurality of connection probes.

Another embodiment is directed toward a probe card for testing a MEMS device. The probe card has a first node electrically coupled to a first needle probe, and a second node electrically coupled to a second needle probe. The probe card also includes a first end of an electrically conductive trace that couples the first node to a first electrical connector and a second end of the electrically conductive trace that couples the second node to a second electrical connector. The electrically conductive trace is constructed and arranged such that the electrical characteristics measured from the first node to the first electrical connector are substantially equal to the electrical characteristics measured from the second node to the second electrical connector. The probe card is configured to implement any embodiments or combination of embodiments described herein.

Another embodiment is directed toward a method of probing a device under test. The method includes coupling a plurality of respective pins to a first end of an electrically conductive trace on a probe card and coupling a plurality of connection points to a second end of the electrically conductive trace on a probe card. Next, the method involves bringing the plurality of probe needles to a plurality of contact points on a device under test such that electrical continuity is created between the probe card and the device under test. The method is configured to implement any embodiments or combination of embodiments described herein.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 1A is an example testing equipment setup for an integrated circuit (IC) tester and IC prober with a probe card and an IC wafer, according to an embodiment.

FIG. 1B is a close-up view of the probe card and wafer of FIG. 1A.

FIG. 1C is a close-up view of the probe card and wafer of FIG. 1A.

FIG. 3 is a flow diagram for an example probe card design for optimal current distribution, according to an embodiment.

DETAILED DESCRIPTION

Figure 1D:
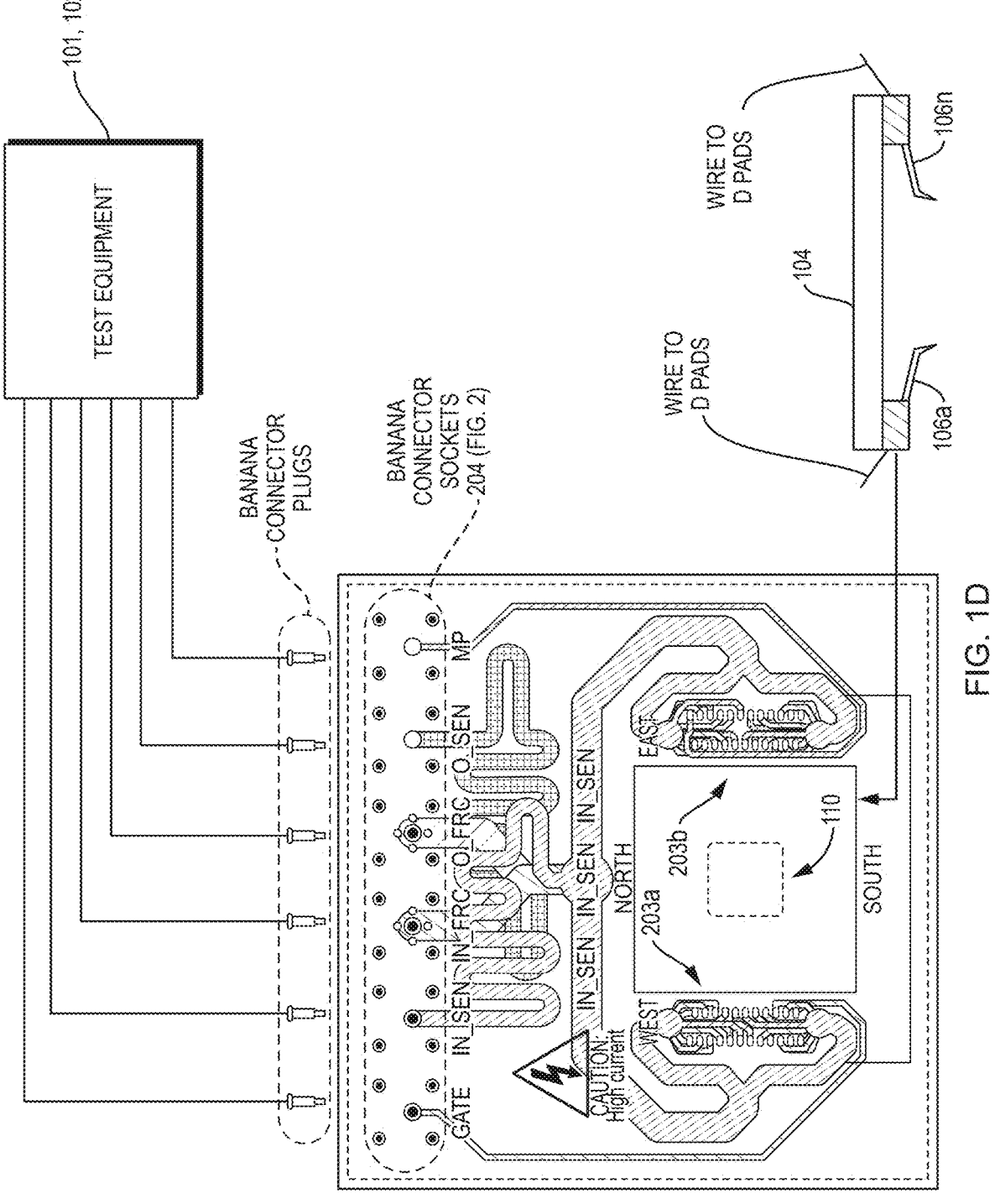
FIG. 1D is a detailed view of an example testing equipment setup for an IC tester and IC prober with a probe card and an IC wafer from FIG. 1A.

A description of example embodiments follows.

While example embodiments have been particularly shown and described, it will be understood by those skilled in the art that various changes in form and details may be made therein without departing from the scope of the embodiments encompassed by the appended claims.

Embodiments utilized herein relate to an improved MEMS test-circuit structure for testing wafer boards. These embodiments improve the current uniformity within the board and in turn allow for more accurate measurements of low resistance MEMS devices as well as improved heat dissipation. These embodiments may be used, for example, with an IC prober on a DUT test setup.

FIG. 1A shows an example wafer tester with a probe card setup 100, according to an embodiment. The DUT probe device 102 is a testing device which will clamp downward onto the DUT wafer 105, sandwiching the probe card 104 and associated probe needles to the pad of the DUT wafer 105. This connection goes through the probe card and through the connection wires 103 from the DUT probe device 102 to the DUT tester 101, which will record the performance of the wafer under test 105 (which comprises the DUT).

FIG. 1B and FIG. 1C show a close-up view of the probe card 104 and wafer 105 from FIG. 1A. The probe needles 106*a-n* are soldered 107 to the probe card 104. The terminal pins 108*a-b* provide connection points to the connection wires 103. In operation, the prober 102 will bring the probe card 104 downward towards the DUT wafer 105, such that the probe needles 106 contact the DUT IC wafer pads 109*a-n*. The epoxy ring 110 provides support to the probe needles 106*a-n*, as well as serving a dielectric function.

FIG. 1D is a detailed view of the example equipment setup 100. The probe card 104 wires into D-Pad connection locations 203*a-b*, which connect to the conductive traces 202*a-e* (Shown in FIG. 2), and then connect through sockets 204 to the test equipment 101 and 102. In an embodiment, the electrical resistance of all traces 202*a-e*, from the test equipment 101, 102 to the probe needles 106*a-n* are substantially identical.

Micro-electrical-mechanical-system (MEMS) switches, i.e., the DUT, may have a 'switch on' resistance that is so low that even a small variation from path to path of the path resistance from a probe needle on the probe card to the testing equipment may cause current to favor one part (i.e., conductive path) of the board over another. This may lead to hot spots on the probe card and DUT as well as potentially incorrect testing readouts. For example, the resistance of the MM9200 integrated circuit (IC) (from Menlo Microsystems, Inc. of Irvine, CA) is relatively low (~10 mΩ), therefore even small variations in resistance between conductive paths on the probe card may cause current to "prefer" one conductive path over another, effectively increasing the stress in parts of the device while decreasing it in others. Therefore, these low resistance DUTs require a unique probe card that substantially equalizes the amount of current that flows through each conductive path on the probe card and therefore uniformly distributes the current in the DUT.

Embodiments disclose a probe card with substantially equal resistance along every path within a plurality of needles on a given probe card needle net. In some embodiments, substantially equal resistance may be a measured resistance within 5% to 10% of each other. Typically, a probe card is designed to have the shortest path from the edge connector pads to the needles, which minimizes the resistance (and complexity) of the design. Since these traces are typically <<1Ω, and a typical device under test (DUT) is ~1Ω, these differences aren't noticeable. However, for DUTs with low resistance, such as the MM9200 having a typical resistance of 1/100th typical devices at ~10 mΩ, the difference in resistance between the paths are noticeable. This means that even small variations in trace length and width may cause a substantial amount of current to favor a particular path, which may significantly impact the performance of the device.

Many legacy probe cards simply have four layers, poured over with copper. This means they have the lowest possible resistance; however, the connection points (and associated conductive traces) nearest the edge connector pads have less resistance than the connection points furthest from them, so most of the current flows through those conductive traces. Since more current is forced to the parts of the DUT connected to those traces, those traces heat more quickly and drastically than those connected elsewhere. This is evident in infrared (IR) camera images (see FIG. 6A), as bright areas near the top of the device and dark areas near the bottom.

Figure 2:
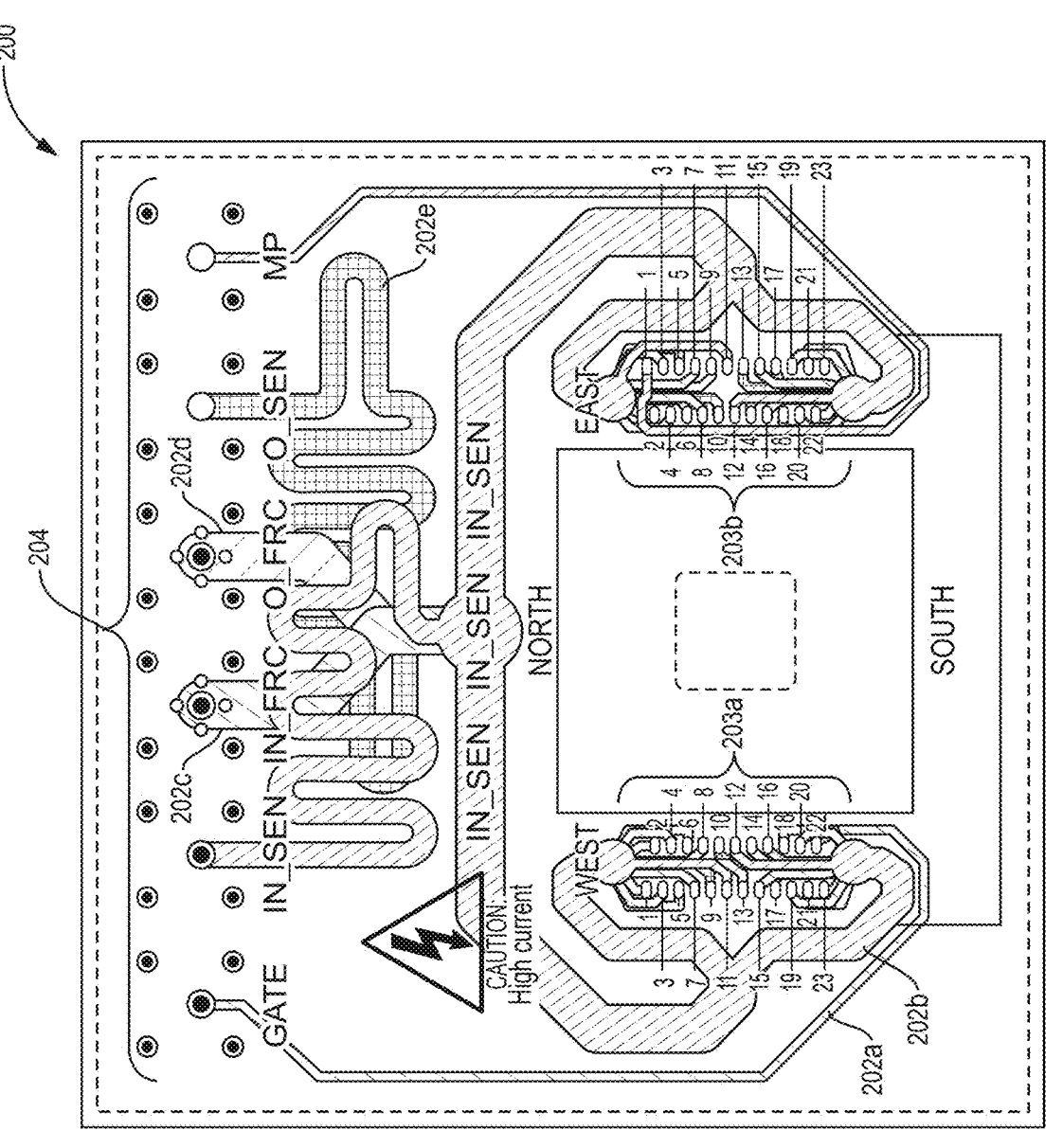
FIG. 2 is an x-ray view of a printed circuit board (PCB) layout of a probe card design for optimal current distribution, according to an embodiment.

Embodiments of the present design were designed to use a tree-like structure that branches out at several points. FIG. 2 shows an example x-ray style view of a probe card design 200, according to an embodiment. This probe card design 200 shows several conductive traces 202*a-e*. These traces 202*a-e* are overlayed on top of one another, and each connect to a plurality of respective pins at a first end of the trace, for example, at probe needle D-Pad connection locations 203*a* and 203*b*. The traces then connect at a second end of the trace, for example, at the plurality of connection locations 204, which in an example embodiment are banana-type connectors. The trace geometry, including the thickness and path of each trace 202*a-e*, is designed specifically such that each trace has an identical resistance from connection locations 203*a-b* to connection locations 204. This can be done by manipulating the trace thickness, the trace length, or both, to alter the resistive properties of each trace. Some embodiments may utilize a combination of trace width and trace length manipulation to achieve the desired overall resistance for a specific trace.

FIG. 3 is a flow diagram 300 for a MEMS test-circuit structure, according to an embodiment. The test-circuit structure includes a wafer layer 301 that has an electrically conductive trace terminating to a plurality of respective pins at a first end of the electrically conductive trace and terminating to a plurality of connection locations at a second of the electrically conductive trace. The wafer layer may be a printed circuit board (PCB). Some embodiments include a second electrically conductive trace terminating to a plurality of respective pins at a first end of the second electrically conductive trace and terminating to a plurality of connection locations at a second end of the electrically conductive trace. In some embodiments the length of the first electrically conductive trace is greater than the length of the second electrically conductive trace such that the resistance of the first electrically conductive trace is substantially equal to the resistance of the second electrically conductive trace. Additionally, in some embodiments, the width of the first electrically conductive trace is greater than the width of the second electrically conductive trace such that the resistance of the first electrically conductive trace is substantially equal to the resistance of the second electrically conductive trace.

Still referring to FIG. 3, the test-circuit structure also contains a plurality of connection probes 302 coupled to the plurality of respective pins at the first end the electrically conductive trace, the connection probes are configured to electrically connect to the MEMS device under test.

Continuing with FIG. 3, in the test-circuit structure, the electrical characteristics 303 of the electrically conductive trace measured from the plurality of connection probes to the plurality of connection locations having substantially identical electrical characteristics. The electrical characteristics may include one or more of electrical resistance, material composition, parasitic inductance, and/or parasitic capacitance. In embodiments, the electrical characteristics of the electrically conductive trace are measured from a furthest end of each connection probe to a test-equipment connection, where the test-equipment connection is located beyond a connection location of the plurality of connection locations. In some embodiments, the test-circuit structure may include an epoxy ring at a central location of the MEMS test-circuit structure, wherein the epoxy ring encompasses the plurality of connection probes.

Figure 4:
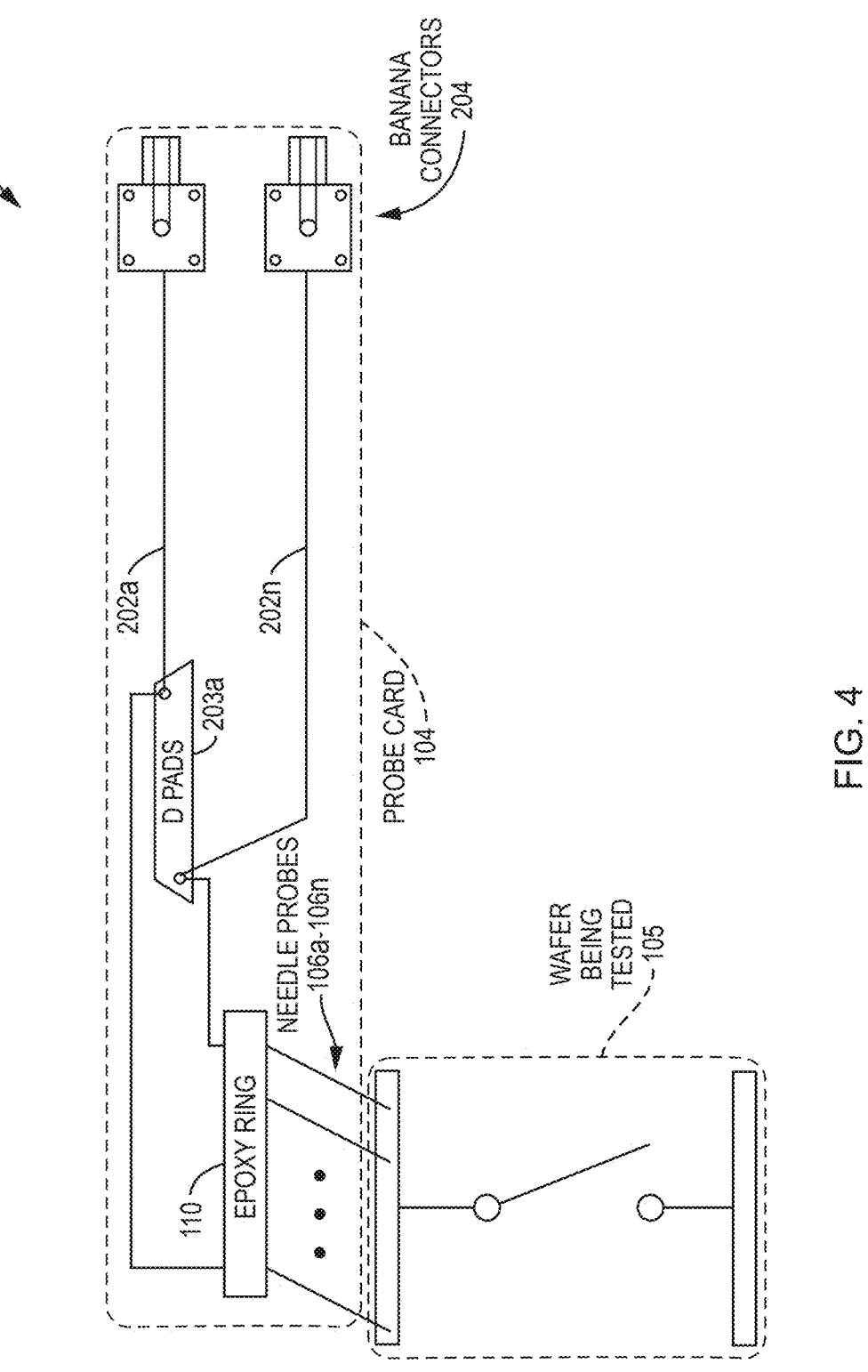
FIG. 4 is a second detailed view of optimized current distribution of the equipment setup from FIG. 1A, according to an embodiment.
Figure 5A:
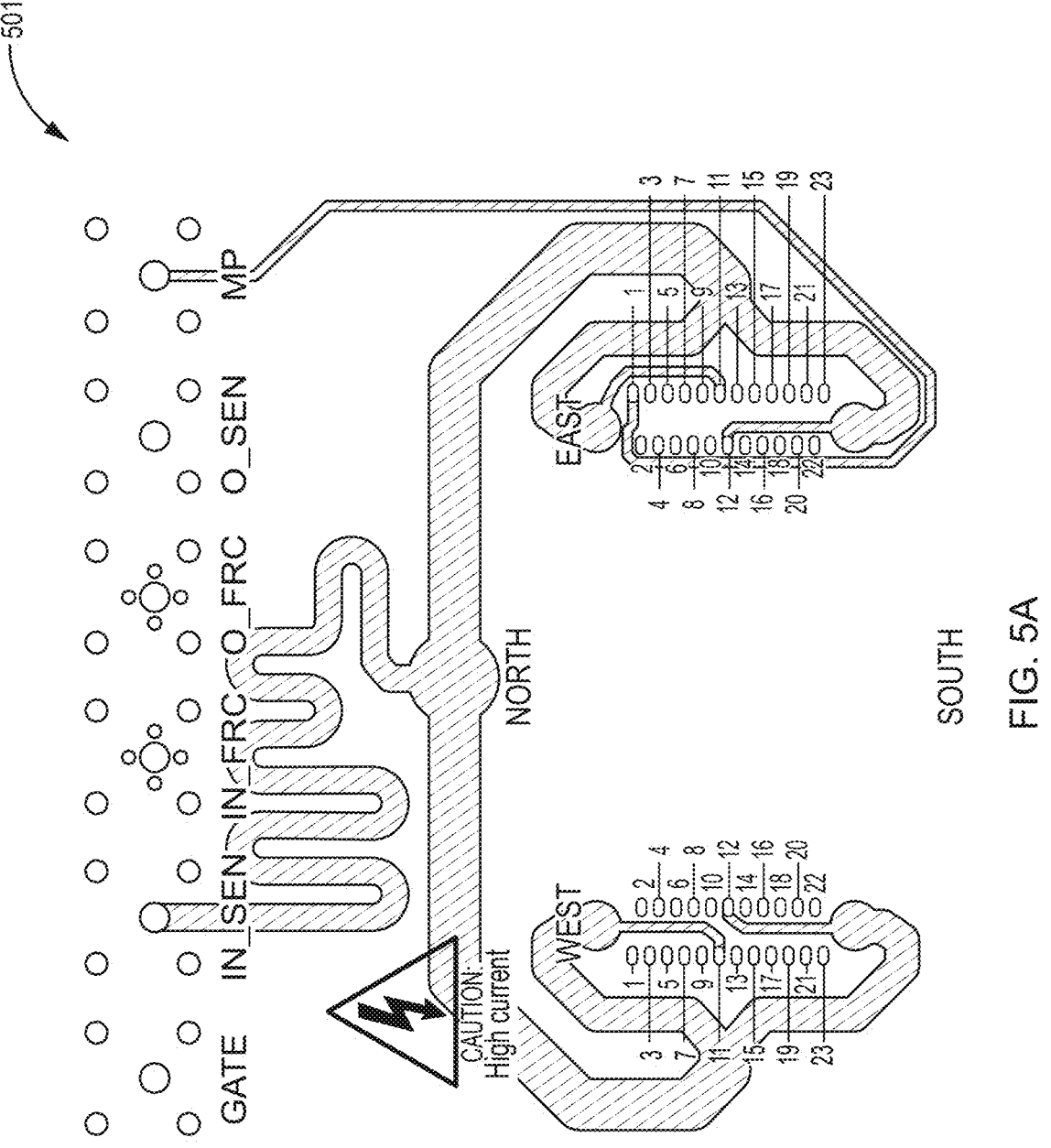
FIGS. 5A-5H show the optimized trace designs, according to an embodiment.
Figure 5B:
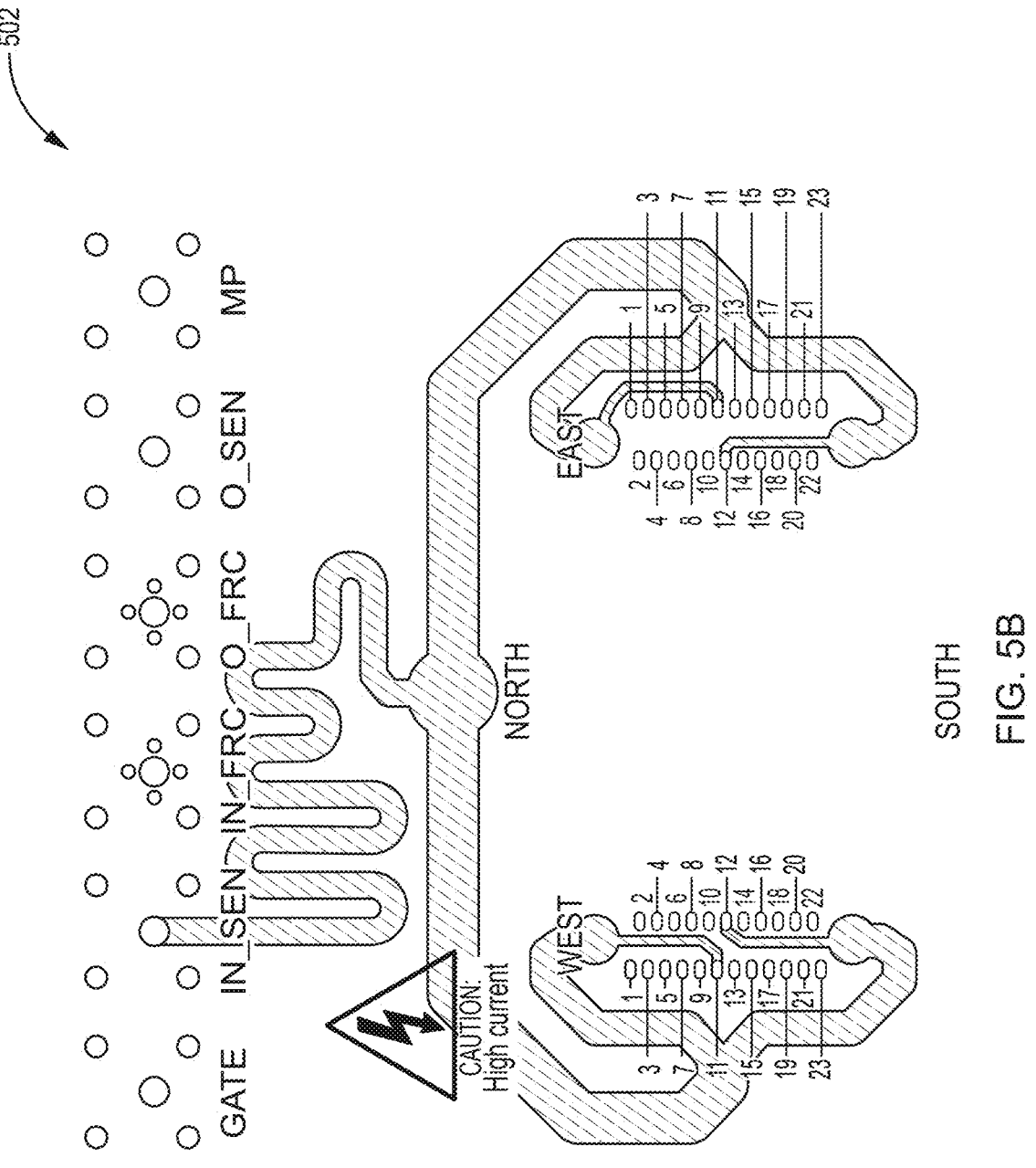
Figure 5C:
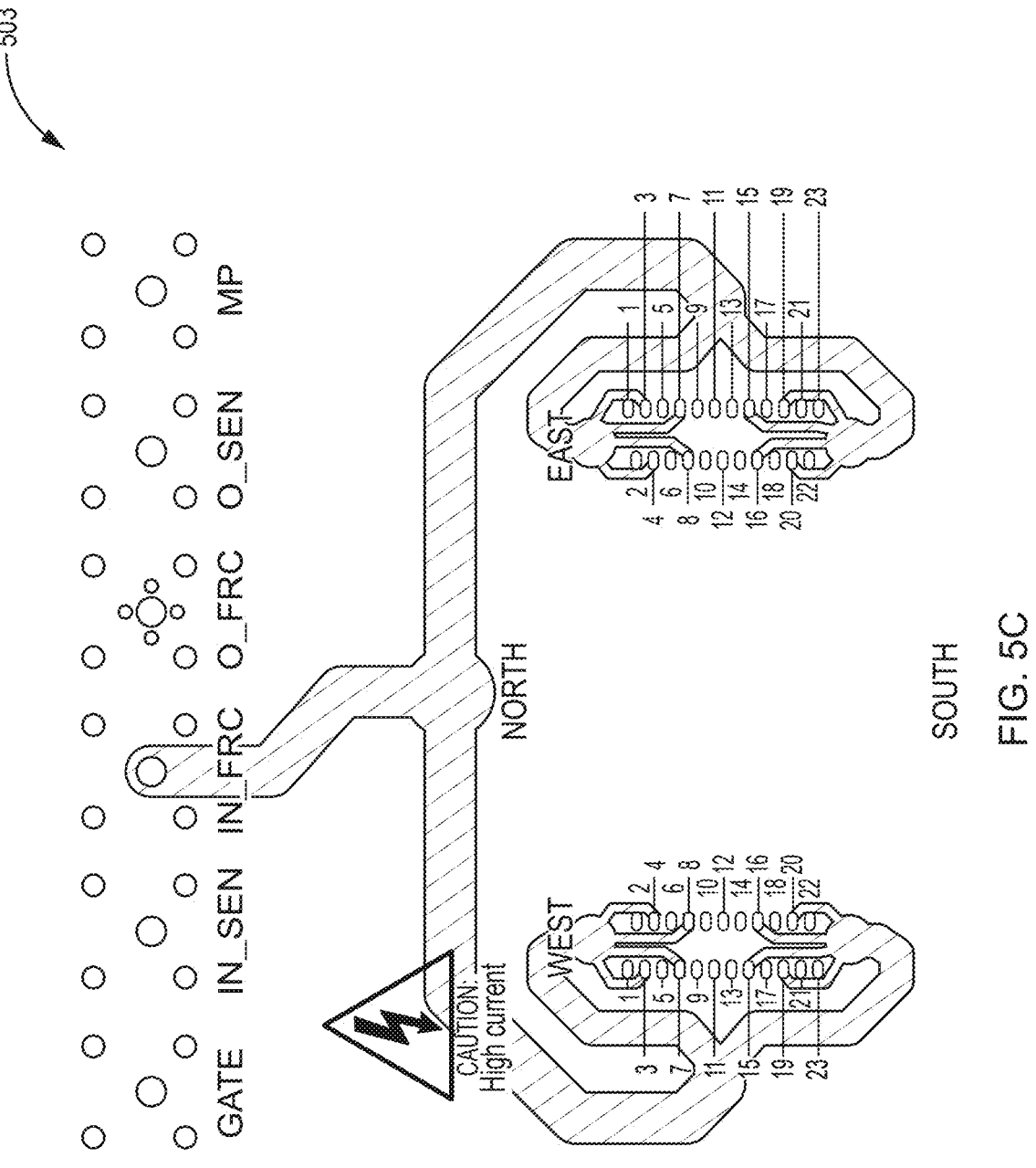
Figure 5D:
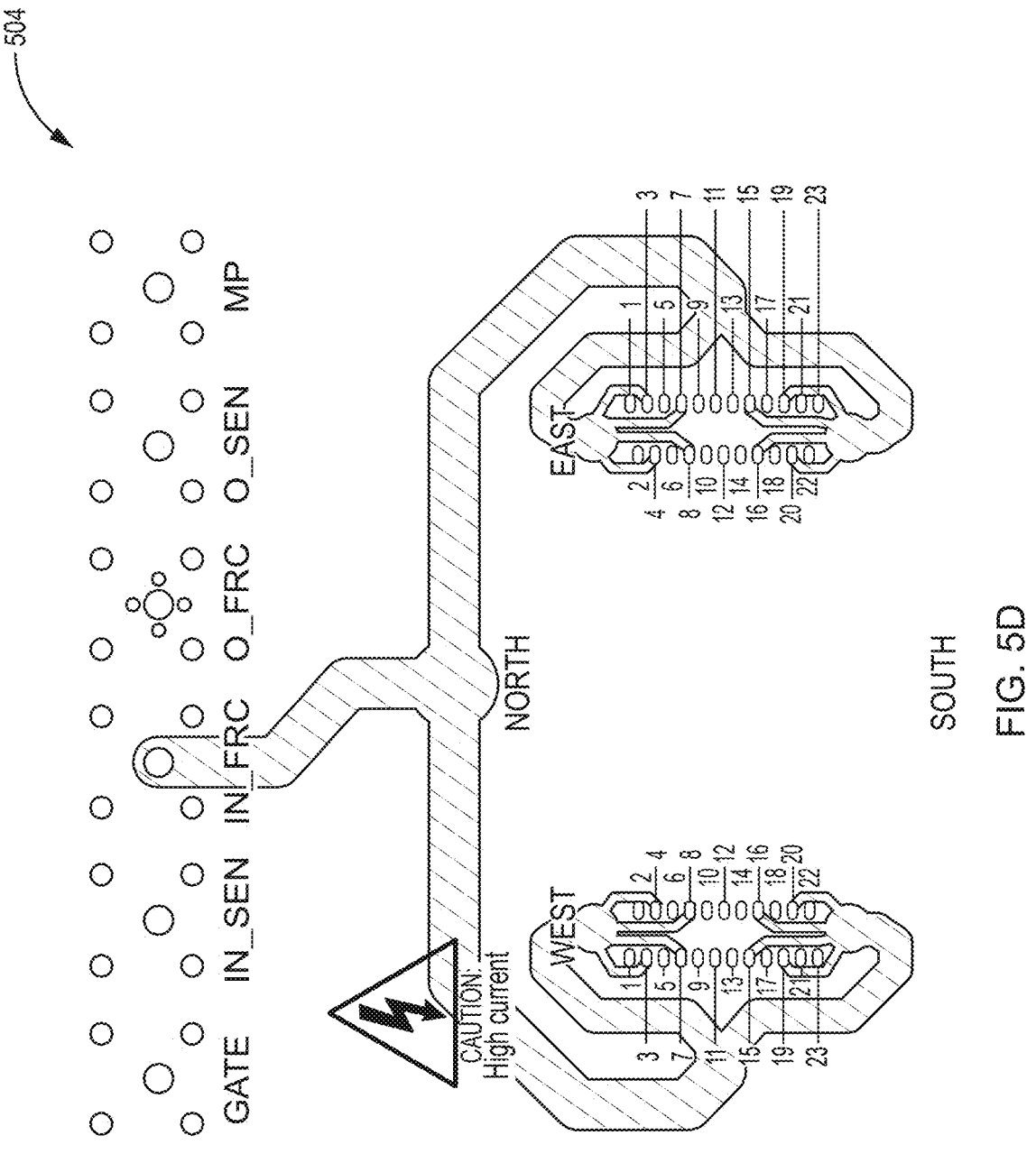
Figure 5E:
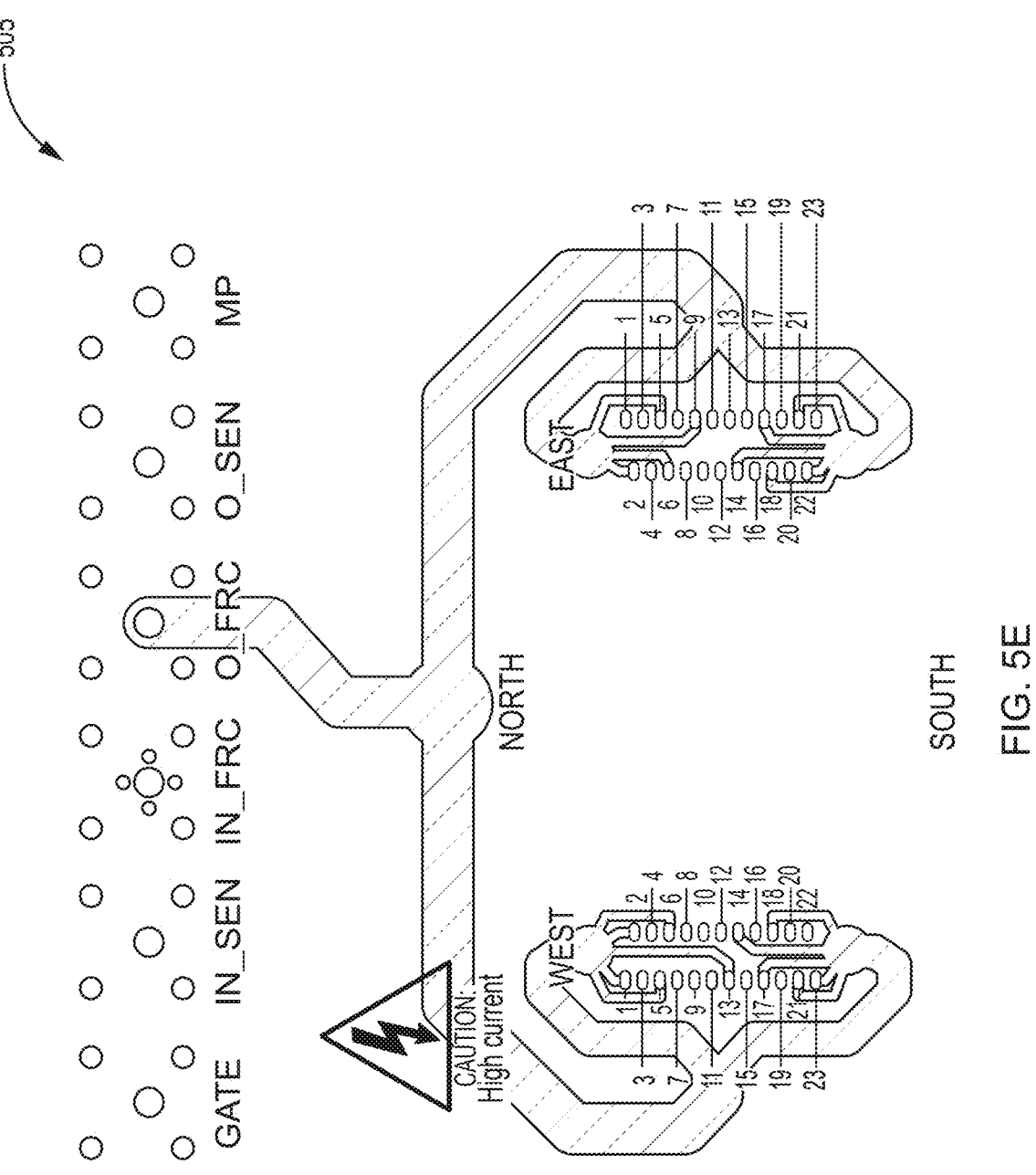
Figure 5F:
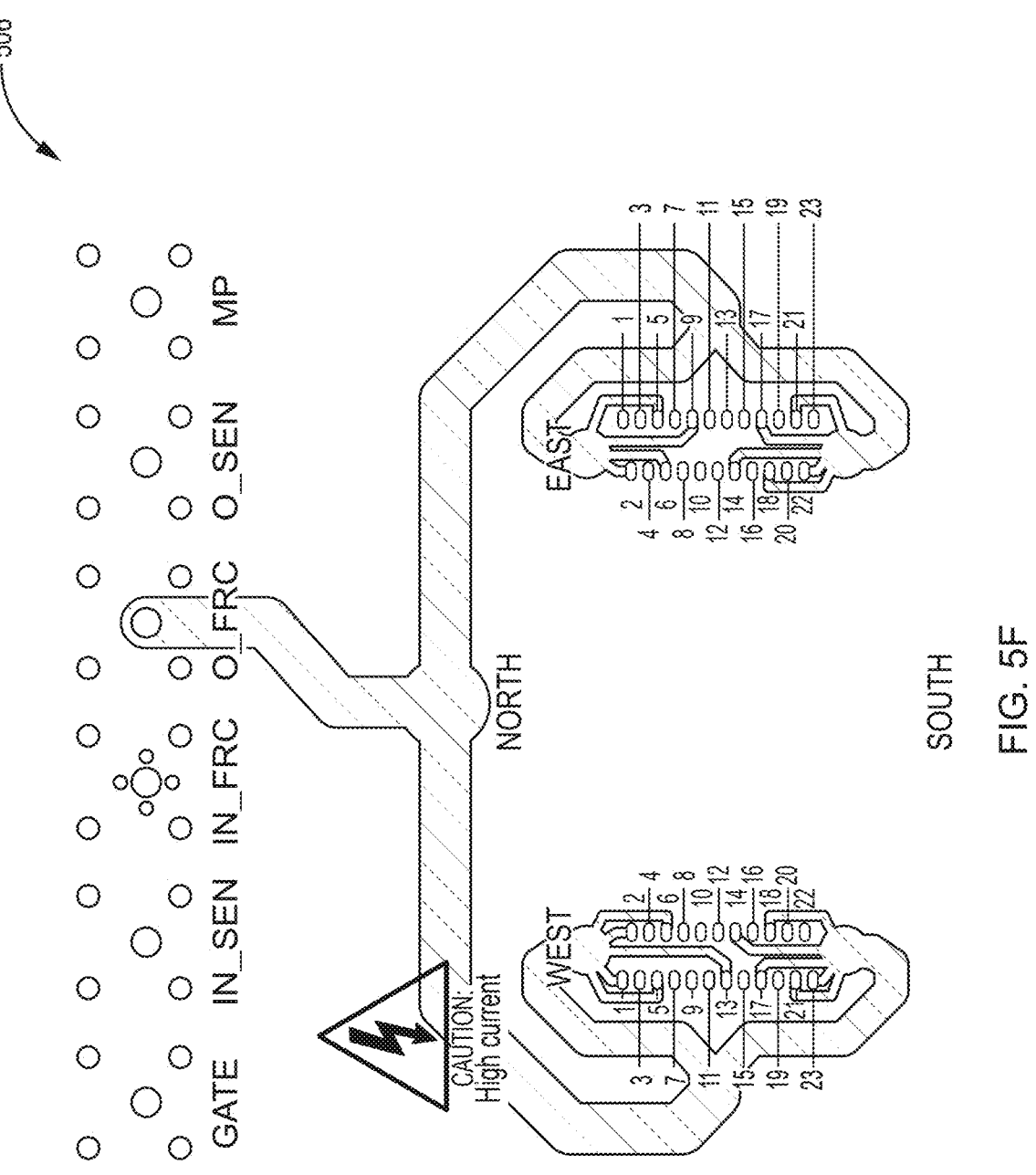
Figure 5G:
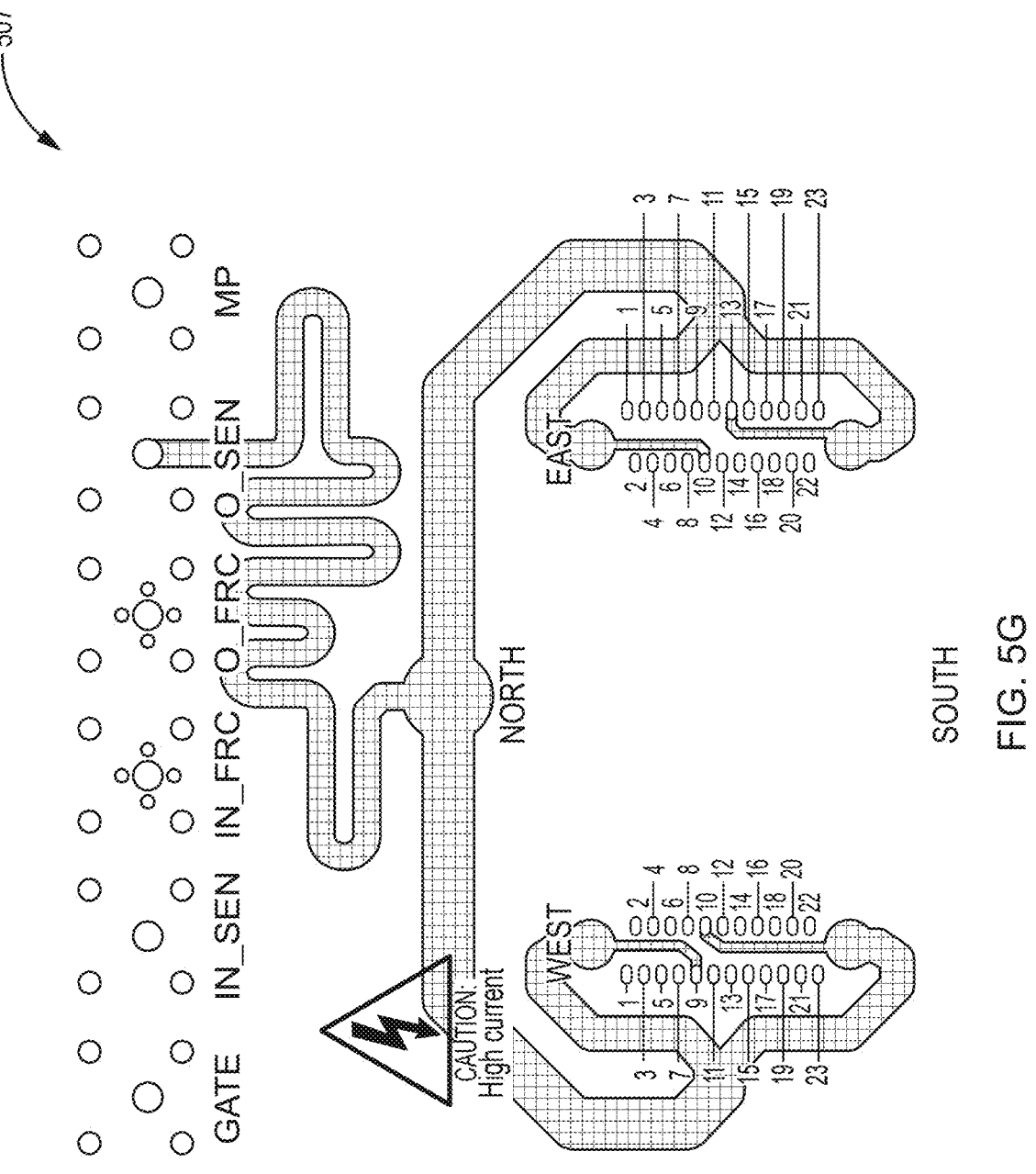
Figure 5H:
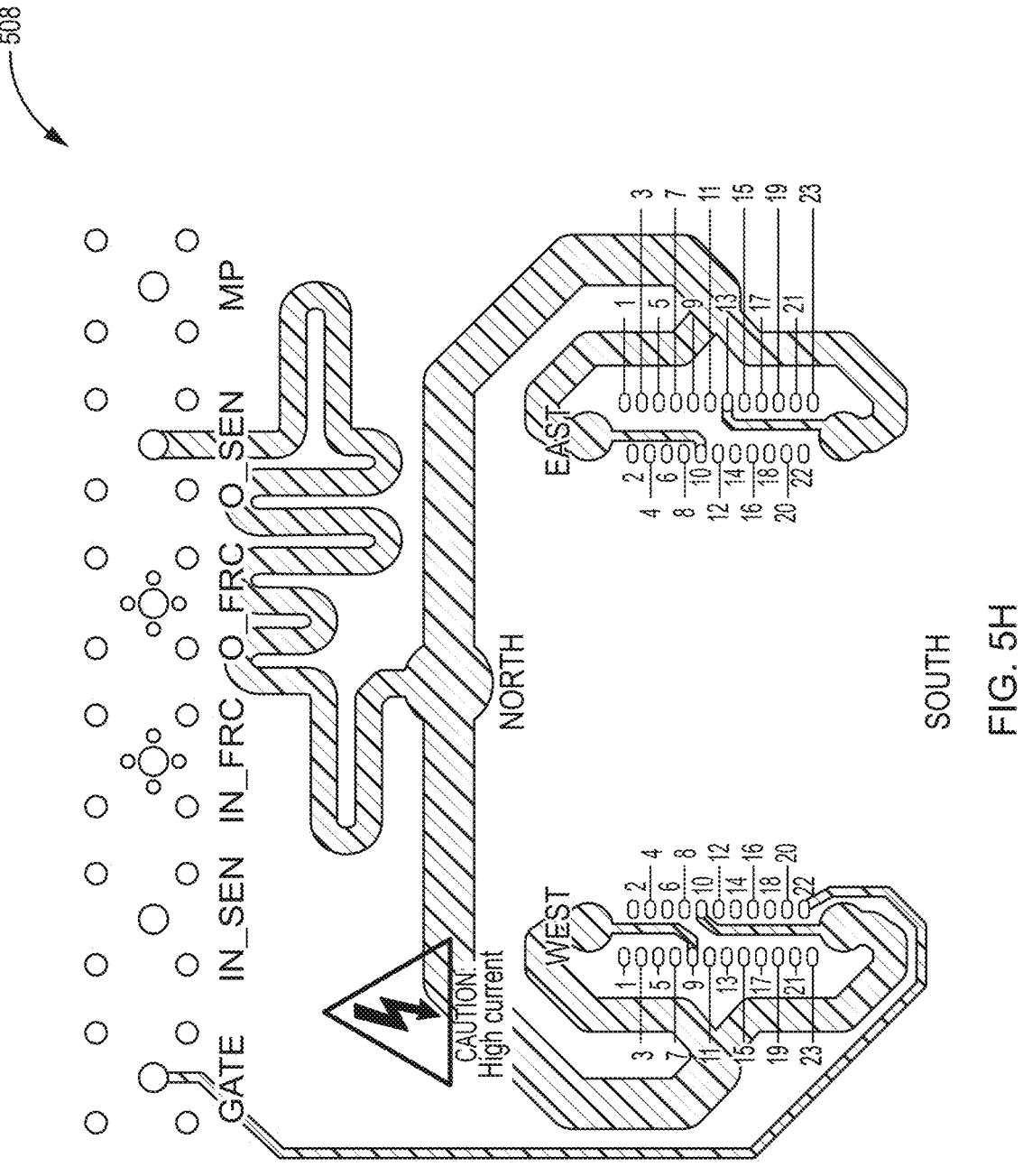

FIG. 4 is a detailed view 400 showing the electrical connection path for the optimized probe card design, according to an embodiment. Only a portion of the system is shown for brevity. In legacy systems, the traces on the probe card PCB would have different trace lengths and routing, and therefore different electrical resistances. A key aspect of present embodiments is to make the resistance of the probe card traces 202a-e substantially identical. Put another way, in an embodiment, the electrical resistance from the top of the probe needles 106a-n through the probe card to the banana connectors 204 is substantially identical.

FIGS. 5A-5H show the optimized trace designs 501-508 for an example eight trace PCB probe card, according to an embodiment. In the trace designs 501-508, the paths from each D-pad connection location (where a probe needle may be soldered) to the end of the trace (which connects to one or more connection locations at the top of the card) have substantially identical electrical characteristics. This is achieved through manipulating the trace geometry such that the trace resistance from each connection location to each pin is substantially identical.

Figure 6B:
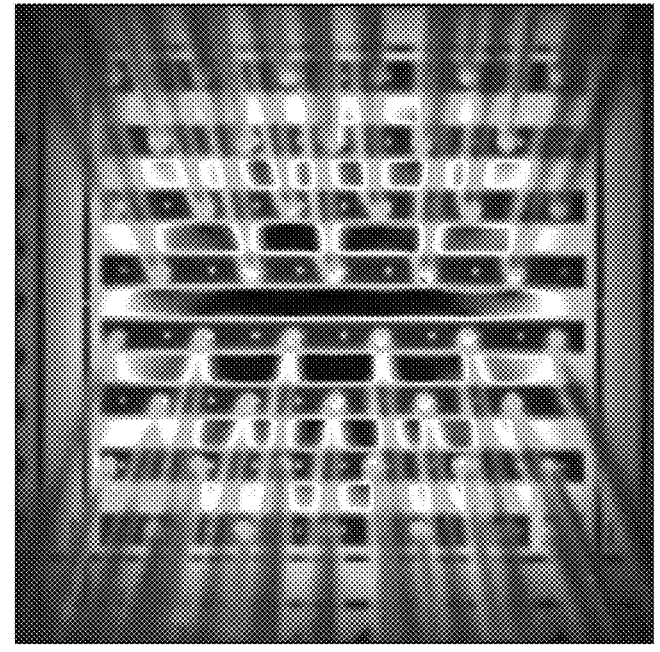
FIGS. 6A and 6B show infrared captures illustrating the heat dissipation between a legacy probe card design and a probe card design according to an embodiment.
Figure 6A:
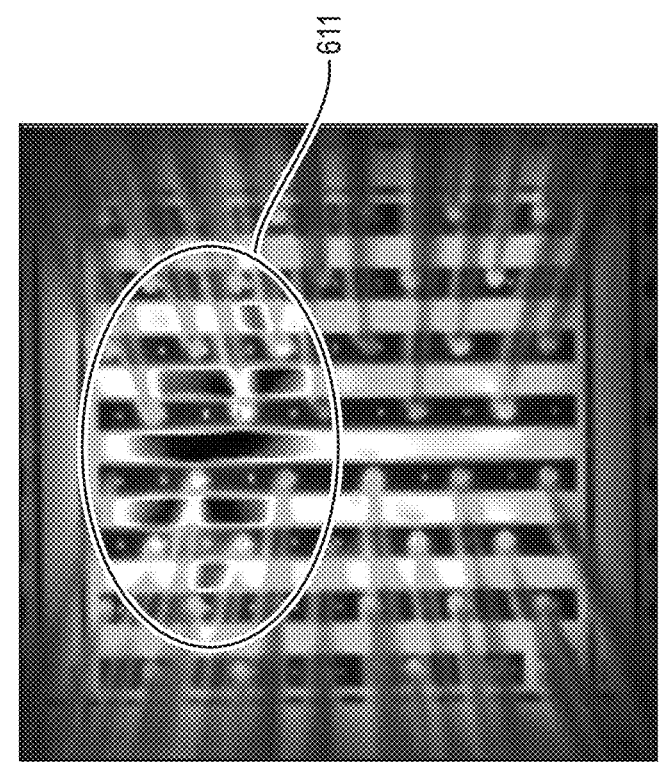

FIGS. 6A and 6B show infrared captures 610 and 620, respectively, illustrating the heat dissipation between a legacy probe card design (FIG. 6A) and a probe card design according to an embodiment (FIG. 6B). Capture 610 shows the heat dissipation on a legacy probe card test wafer. As can be seen by the circled region 611, the darker red colors within the infrared image show that the higher temperature occurrences due to current flow in a particular conductive trace (or a few conductive traces) is concentrated in one area, while the cooler regions (shown with blue in this image). Capture 620 shows the heat dissipation on a probe card test wafer according to embodiments utilized herein. As can be seen in capture 620m the heat due to current flow is evenly distributed throughout the entire device.

Embodiments disclosed herein provide additional advantages to four-wire-testing configurations. Four-wire-testing is intended to provide more accurate ohmmeter measurements, when compared to two-wire-testing, for example. In two-wire-testing, the ohmmeter uses only two connection points to probe the DUT. This can be advantageous, because it is simple, but has its drawbacks. One of the main drawbacks being that in two-wire-testing, the ohmmeter measures not only the voltage drop (and by extension of Ohm's law, resistance) across the DUT, but also must include the resistance of the probes in its calculation. Four-wire-testing, on the other hand, does not need to include the resistance of the probes in its calculation. Four-wire-testing utilizes four connection probes, a positive force probe, a negative force probe, a positive sense probe, and a negative sense probe. Both positive probes connect to the positive end of the DUT, and both negative probes connect to the negative end of the DUT. The ohmmeter measurement is made between the points where the force and sense leads connect. This effectively eliminates the resistance of the leads from the measurement. This allows the ohmmeter to measure lower resistances more accurately. In this testing configuration, it would be beneficial to have each net of the connection probes to have substantially identical electrical characteristics. Having the same electrical characteristics, such as resistance, enables the card to be used interchangeable with two-wire measurements and four-wire measurements. Embodiments provide for such functionality.

While example embodiments have been particularly shown and described, it will be understood that various changes in form and details may be made therein without departing from the scope of the embodiments encompassed or contemplated herein.

What is claimed is:

1. A micro-electrical-mechanical-system (MEMS) test-circuit structure, comprising:
   a wafer layer comprising an electrically conductive trace terminating to a plurality of respective pins at a first end of the electrically conductive trace and terminating to a plurality of connection locations at a second end of the electrically conductive trace;
   a plurality of connection probes coupled to the plurality of respective pins at the first end of the electrically conductive trace, the connection probes configured to electrically connect to a MEMS device under test; and
   electrical characteristics of the electrically conductive trace measured from the plurality of connection probes to the plurality of connection locations having substantially identical electrical characteristics.

2. The MEMS test-circuit structure of claim 1, further comprising an epoxy ring at a central location of the MEMS test-circuit structure, wherein the epoxy ring encompasses the plurality of connection probes.

3. The MEMS test-circuit structure of claim 1, wherein the electrical characteristics of the electrically conductive trace are measured from a furthest end of each connection probe of the plurality of connection probes, to a test-equipment connection, wherein the test-equipment connection is located beyond a connection location of the plurality of connection locations.

4. The MEMS test-circuit structure of claim 1, further comprising:
   a second electrically conductive trace terminating to a plurality of respective pins at a first end of the second electrically conductive trace; and
   the second electrically conductive trace terminating to a plurality of connection locations at a second end of the second electrically conductive trace.

5. The MEMS test-circuit structure of claim 4, wherein a length of the first electrically conductive trace is greater than a length of the second electrically conductive trace such that resistance of the first electrically conductive trace is substantially equal to resistance of the second electrically conductive trace.

6. The MEMS test-circuit structure of claim 4, wherein a width of the first electrically conductive trace is greater than a width of the second electrically conductive trace such that resistance of the first electrically conductive trace is substantially equal to resistance of the second electrically conductive trace.

7. The MEMS test-circuit structure of claim 1, wherein the electrical characteristics comprise one or more of electrical resistance, material composition, parasitic inductance, and/or parasitic capacitance.

8. The MEMS test-circuit structure of claim 1, wherein the wafer layer is a printed circuit board (PCB).

9. A probe card for testing a micro-electrical-mechanical-system (MEMS) device, comprising:

a first node electrically coupled to a first needle probe, and a second node electrically coupled to a second needle probe;

a first end of an electrically conductive trace that couples the first node to a first electrical connector;

a second end of the electrically conductive trace that couples the second node to a second electrical connector;

the electrically conductive trace being constructed and arranged such that electrical characteristics measured from the first node to the first electrical connector are substantially equal to electrical characteristics measured from the second node to the second electrical connector.

10. The probe card of claim 9, wherein the probe card is a printed circuit board (PCB).

11. The probe card of claim 9, wherein the length of the electrically conductive trace between the first node and the first electrical connector is greater than the length of the electrically conductive trace between the second node and the second electrical connector.

12. The probe card of claim 11, wherein the electrically conductive trace geometry of the electrically conductive trace between the first node and the first electrical connector is such that the electrical characteristics measured between the first node and the first electrical connector, and the electrical characteristics measured between the second node and the second electrical connector are substantially equal.

13. A method of probing a device under test, the method comprising:

coupling a plurality of probe needles to a first end of an electrically conductive trace on a probe card;

coupling a plurality of connection points to a second end of the electrically conductive trace on a probe card; and bringing the plurality of probe needles to a plurality of contact points on a device under test such that electrical continuity is created between the probe card and the device under test.

14. The method of probing a device under test of claim 13, wherein electrical resistance measured from any probe needle of the plurality of probe needles to any connection point of the plurality of connection points is substantially identical to each other.

15. The method of probing a device under test of claim 13, wherein the plurality of probe needles are capable of flexing, such that the flex of the probe needles provides constant pressure onto the contact points of the device under test.

16. The method of probing a device under test of claim 13, wherein a length of the electrically conductive trace from a first probe needle to a first connection point is greater than a length of the electrically conductive trace from a second probe needle to a second connection point, such that resistance of the electrically conductive trace measured from the first probe needle to a first connection point is substantially equal to resistance of the electrically conductive trace measured from the second probe needle to a second connection point.

17. The method of probing a device under test of claim 13, wherein a width of the electrically conductive trace from a first probe needle to a first connection point is greater than a width of the electrically conductive trace from a second probe needle to a second connection point, such that resistance of the electrically conductive trace measured from the first probe needle to a first connection point is substantially equal to resistance of the electrically conductive trace measured from the second probe needle to a second connection point.

18. The method of probing a device under test of claim 13, wherein the probe card is a printed circuit board (PCB).

* * * * *